US009465062B2

(12) United States Patent
Chu et al.

(10) Patent No.: US 9,465,062 B2
(45) Date of Patent: Oct. 11, 2016

(54) DEVICE AND METHOD FOR AUTOMATICALLY DETECTING LOW VOLTAGE DIFFERENTIAL SIGNAL INTERFACE MATCHING RESISTOR (71) Applicants: BOE TECHNOLOGY GROUP CO., LTD., Beijing (CN); BEIJING BOE DISPLAY TECHNOLOGY CO., LTD., Beijing (CN)

(72) Inventors: Lulu Chu, Beijing (CN); Ji Zhang, Beijing (CN); Tianchao Wang, Beijing (CN)

(73) Assignees: BOE Technology Group Co., Ltd. (CN); Beijing BOE Display Technology Co., Ltd. (CN)

( * ) Notice: Subject to any disclaimer, the term of this patent is extended or adjusted under 35 U.S.C. 154(b) by 245 days.

(21) Appl. No.: 14/498,807

(22) Filed: Sep. 26, 2014

(65) Prior Publication Data

US 2015/0323564 A1 Nov. 12, 2015

(30) Foreign Application Priority Data

May 9, 2014 (CN) .......................... 2014 1 0196010

(51) Int. Cl.
G01R 27/08 (2006.01)
G01R 27/14 (2006.01)
G01R 1/04 (2006.01)
G01R 27/02 (2006.01)

(52) U.S. Cl.
CPC ............ *G01R 27/14* (2013.01); *G01R 1/0416* (2013.01); *G01R 27/02* (2013.01)

(58) Field of Classification Search
CPC ................ G01L 23/221; G01N 2291/02863; G01V 3/101; H01L 2924/0002; G01R 33/3621; G01R 33/3692; G01R 33/093
USPC ................ 324/724, 600, 452–453, 500, 514, 324/754.04, 691, 415–433, 522–525, 549, 324/713; 714/724, E11.155, 61, 10, 757, 714/712, 700, 725; 327/94, 96, 89, 68
See application file for complete search history.

(56) References Cited

U.S. PATENT DOCUMENTS

2003/0122593 A1* 7/2003 Volk ...................... H04L 25/028
327/108
2006/0202714 A1* 9/2006 Hoang ................ G06F 17/5054
326/38
2009/0167369 A1 7/2009 Liu et al.

FOREIGN PATENT DOCUMENTS

CN 1869722 A 11/2006
CN 101211302 A 7/2008
CN 201281695 Y 7/2009
CN 102298092 A 12/2011
CN 203193684 U 9/2013
CN 103675458 A 3/2014

OTHER PUBLICATIONS

Office Action in Chinese Patent Application No. 201410196010.7, dated Jan. 29, 2016.

* cited by examiner

*Primary Examiner* — Vincent Q Nguyen
*Assistant Examiner* — Trung Nguyen
(74) *Attorney, Agent, or Firm* — BakerHostetler LLP (57) ABSTRACT The present disclosure provides a device and method for automatically detecting an LVDS interface matching resistor. In the device, multiple detection interface units each including two terminals for being connected with two ends of the LVDS interface matching resistor, are set; at least one switch unit is connected between corresponding detection interface unit and a processing unit and the switch unit and the detection interface unit are set correspondingly; and a processing unit is used for controlling the switch unit to be in the conducting state, so that the detection interface unit corresponding to the switch unit in the conducting state and the processing unit form a detection loop, and by use of the detection loop, the processing unit performs measurement to the LVDS interface matching resistor connected to the detection interface unit corresponding to the switch unit in the conducting state.

15 Claims, 5 Drawing Sheets

DEVICE AND METHOD FOR AUTOMATICALLY DETECTING LOW VOLTAGE DIFFERENTIAL SIGNAL INTERFACE MATCHING RESISTOR

CROSS-REFERENCE TO RELATED APPLICATION

The present disclosure claims a priority of the Chinese patent application No. 201410196010.7 filed on May 9, 2014, which is incorporated herein by reference in its entirety.

TECHNICAL FIELD

The present disclosure relates to the field of display technology, in particular to a device and method for automatically detecting a low voltage differential signal (LVDS) interface matching resistor.

BACKGROUND

Currently, a liquid crystal module (LCM) and an open cell mainly adopt LVDS to perform display signal transmission.

Generally, LVDS is transmitted by more than four pairs of differential signal lines, each pair having two wires between which there is a 100Ω matching resistor for impedance matching.

Figure 1:
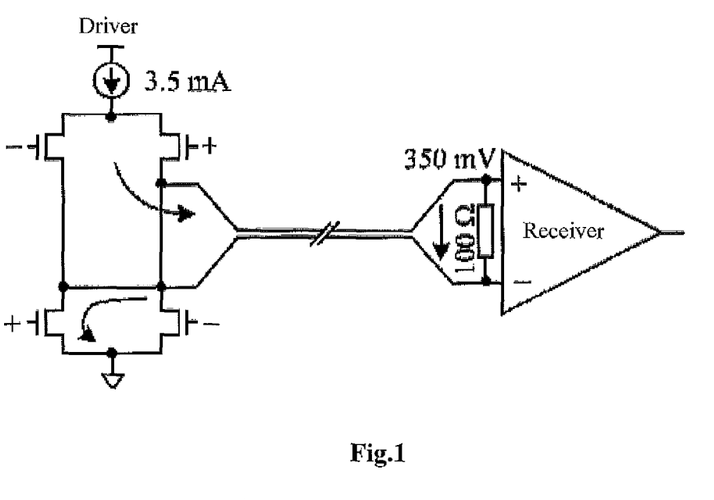
FIG. 1 is a schematic view showing an existing LVDS device.

An LVDS driver and an LVDS receiver are the most basic LVDS devices; as shown in FIG. 1, the LVDS driver is composed of a current source, which is used for driving a pair of LVDS lines and has a current of usually 3.5 mA, and the LVDS receiver has a very high input impedance; therefore, most of the current output by the LVDS driver flows through the 100Ω matching resistor, and a voltage of about 350 mV is generated at the input end of the LVDS receiver.

In the process of producing an LCM and an open cell, the LVDS interface matching resistor in the drive circuit board often falls off to get lost, which causes poor image output of the LCM and the open cell. Because there are many resistors and other components on the drive circuit board, it is difficult to find the loss of the matching resistor in time, thus influencing efficiency of the product failure analysis.

In addition, under the condition of faulty soldering LVDS interface matching resistor, it is almost impossible to find the matching resistor anomaly in appearance, and the only way is through a manual way to detect every matching resistor using an electronic multimeter; therefore, it is difficult and time consuming to find the abnormal matching resistor, which makes it more difficult for the product failure analysis.

SUMMARY

The present disclosure provides a device and method for detecting an LVDS interface matching resistor, capable of automatically realizing measurement of the LVDS interface matching resistor, having the features of precise and reliable analysis, simple operation, and strong practicability, and effectively improving the detection efficiency of the matching resistor and the product failure analysis ability.

The present disclosure provides the following technical solutions.

One embodiment in the present disclosure provides a device for automatically detecting an LVDS interface matching resistor, comprising a plurality of detection interface units, at least one switch unit and a processing unit; wherein:

each detection interface unit comprises two terminals for being connected with two ends of the LVDS interface matching resistor;

the at least one switch unit and the plurality of detection interface units are set correspondingly, and a switch unit in the at least one switch unit corresponding to a detection interface unit is connected between the processing unit and the corresponding detection interface unit;

the processing unit is used for controlling the switch unit corresponding to the detection interface unit to be in a conducting state, so that the detection interface unit corresponding to the switch unit in the conducting state and the processing unit forms a detection loop, and the processing unit, by use of the detection loop, performs measurement to the LVDS interface matching resistor connected to the detection interface unit corresponding to the switch unit in the conducting state.

Optionally, the switch unit is a dual-channel switch unit, and a plurality of dual-channel switch units are included in the device; and the detection interface units and the dual-channel switch units are connected in one to one correspondence, wherein, one ends of two channels in a dual-channel switch unit are connected with two terminals of a detection interface unit respectively, and the other ends of the two channels in the dual-channel switch unit are connected with the processing unit Optionally, the switch unit is a single-channel switch unit, and a plurality of single-channel switch units are included in the device; and each of the detection interface units is connected with two single-channel switch units correspondingly, wherein one ends of the two single-channel switch units are connected with two terminals of a detection interface unit respectively, and the other ends of the two single-channel switch units are connected with the processing unit.

Optionally, when there are a plurality of switch units, the switch units comprise:

a first switch unit group, wherein, one end of a switch unit included in the first switch unit group is connected with one of two terminals of the corresponding detection interface unit in the plurality of detection interface units, and the other end of the switch unit included in the first switch unit group is connected with the processing unit; and a second switch unit group, wherein, one end of a switch unit included in the second switch unit group is connected with the other one of the two terminals of the corresponding detection interface unit in the plurality of detection interface units, and the other end of the switch unit included in the second switch unit group is connected with the processing unit.

Optionally, the switch unit is a multi-channel switch unit, and at least one multi-channel switch unit is included in the device; and a channel in the multi-channel switch unit has one end connected with one of the terminals and the other end connected with the processing unit.

Optionally, the processing unit includes:

a gating unit for controlling the switch unit corresponding to the detection interface unit to be in the conducting state, to make the detection interface unit corresponding to the switch unit in the conducting state and the processing unit form the detection loop;

a measurement unit for measuring the LVDS interface matching resistor connected to the detection interface unit corresponding to the switch unit in the conducting state.

Optionally, when the measurement unit acquires the measurement result of the LVDS interface matching resistor, the measurement unit synchronously determines whether the LVDS interface matching resistor is in a normal condition.

Optionally, the switch unit has an encoded address; the processing unit also comprises:

a storage unit for recording the encoded address of the switch unit correspondingly.

Optionally, the gating unit queries the storage unit, acquires the encoded address of the corresponding switch unit, and sends a gating control signal to the corresponding switch unit based on the encoded address to make the corresponding switch unit to be in the conducting or non-conducting state.

Optionally, the processing unit also includes:

an information receiving unit for receiving externally inputted detection information; and/or an information sending unit for sending measurement result of the LVDS interface matching resistor to an external apparatus.

Optionally, the automatic detection device also includes at least one of a communication interface, a power supply interface, a prompt module and a display module; wherein:

the communication interface is used for realizing information interaction between the device and an external apparatus;

the power source interface is used for receiving an externally inputted power source and supplying the power source to electric components included in the device;

the prompt module is used for making a prompt when the processing unit acquires the measurement result of the LVDS interface matching resistor; and the display module is used for displaying the measurement result of the LVDS interface matching resistor acquired by the processing unit.

Optionally, the prompt module comprises an LED light and a driver for driving the LED light to blink Optionally, the measurement result of the LVDS interface matching resistor is sent to an external apparatus through the communication interface.

The embodiment in the present disclosure also provides a method for automatically detecting LVDS interface matching resistor, including:

receiving, by a processing unit, information of the LVDS interface matching resistor to be detected;

determining, by the processing unit, information of at least one switch unit corresponding to a detection interface unit connected with the LVDS interface matching resistor;

controlling, by the processing unit, the at least one switch unit to be in a conducting state to make the detection interface unit corresponding to the switch unit in the conducting state and the processing unit form a detection loop, and measuring the LVDS interface matching resistor connected to the detection interface unit corresponding to the switch unit in the conducting state.

Optionally, the step of controlling, by the processing unit, the at least one switch unit to be in the conducting state comprises:

controlling, by the processing unit, a first switch unit and a second switch unit to be in the conducting state respectively, wherein the first switch unit is in a first switch unit group, the second switch unit is in a second switch unit group, the first switch unit is connected to a first terminal in a first detection interface unit, and the second switch unit is connected to a second terminal of the first detection interface unit.

We can see from the above mentioned that, the present disclosure provides a device and method for automatically detecting an LVDS interface matching resistor, and in the device, multiple detection interface units, at least one switch unit and a processing unit are set, wherein each detection interface unit includes two terminals for being connected with two ends of the LVDS interface matching resistor, the at least one switch unit and the multiple detection interface units are set correspondingly, and the switch unit in the at least one switch unit corresponding to the detection interface unit is connected between the processing unit and the corresponding detection interface unit, the processing unit is used for controlling the switch unit corresponding to the detection interface unit to be in the conducting state, so that the detection interface unit corresponding to the switch unit in the conducting state and the processing unit form a detection loop, and by use of the detection loop, the processing unit performs measurement to the LVDS interface matching resistor connected to the detection interface unit corresponding to the switch unit in the conducting state. Thus, the device can automatically realize the measurement of the LVDS interface matching resistor, has the features of precise and reliable analysis, simple operation, and strong practicability, and effectively improves the detection efficiency of matching resistor and the product failure analysis ability.

DETAILED DESCRIPTION

In order to make the objects, the technical solutions and the beneficial effects of the embodiments of the present disclosure more clear, the technical solutions of the present disclosure are clearly and completely described hereinafter in conjunction with the drawings of the embodiments, and it is apparent that the described embodiments are just one part of the embodiments of the present disclosure. Based on the described embodiments of the present disclosure, all the other embodiments obtained by the person skilled in the art belong to the scope of the present disclosure.

Unless otherwise defined, the used technical terms or scientific terms herein should have normal meanings understood by the person skilled in the art of the present disclosure. The words used in the specification and the claims of the present disclosure, such as "first" "second" and the like do not indicate any sequence, number, or significance, but are merely used to distinguish different components. Similarly, "a" or "an" and similar expressions do not represent a number limit, but the presence of at least one. "On", "under", "left" and "right" and other expressions are merely used to represent relative position relationship, and when the absolute position of the described object changes, the relative position relationship will change accordingly.

Figure 2:
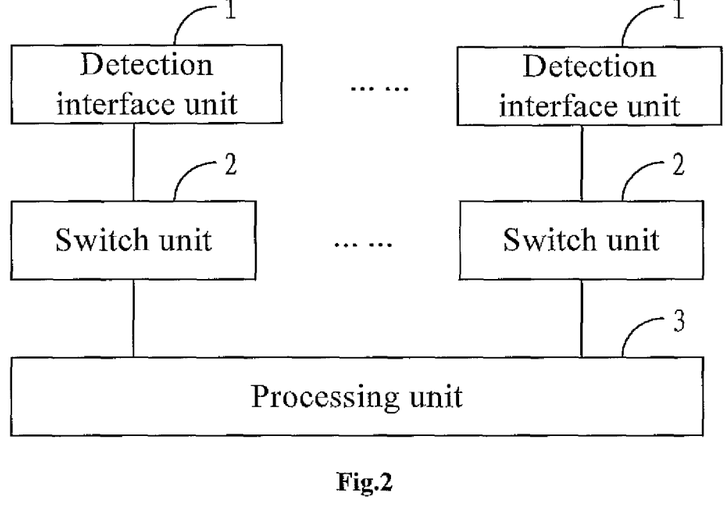
FIG. 2 is a first schematic view showing the structure of an automatic detection device of the LVDS interface matching resistor according to an embodiment of the present disclosure.

One embodiment of the present disclosure provides a device for automatically detecting an LVDS interface matching resistor, as shown in FIG. 2, the automatic detection device includes multiple detection interface units 1, at least one switch unit 2 and a processing unit 3;

wherein:

each detection interface unit 1 includes two terminals for being connected with two ends of the LVDS interface matching resistor;

the at least one switch unit 2 and the multiple detection interface units 1 are set correspondingly, and a switch unit in the at least one switch unit 2 corresponding to the detection interface unit is connected between the processing unit 3 and corresponding detection interface unit 1;

the processing unit 3 is used for controlling the switch unit corresponding to the detection interface unit to be in a conducting state, so that the detection interface unit 1 corresponding to the switch unit 2 in the conducting state and the processing unit 3 forms a detection loop, and by use of the detection loop, the processing unit 3 performs detection to the LVDS interface matching resistor connected to the detection interface unit 1 corresponding to the switch unit 2 in the conducting state.

The automatic detection device provided in the present disclosure can automatically realize the detection of the LVDS interface matching resistor, has the features of precise and reliable analysis, simple operation and strong practicability, and effectively improves detection efficiency of the matching resistor and the product failure analysis ability.

In the embodiment of the present disclosure, during the process of realizing automatic detection of the LVDS interface matching resistor, there is a need for the processing unit 3 to be able to control the corresponding switch unit 2 to be in the conducting state, so as to make the detection interface unit 1 corresponding to the switch unit 2 and the processing unit 3 form a detection loop, so that the processing unit 3 performs automatic detection to the LVDS interface matching resistor connected with the two terminals, namely pins, of the detection interface unit 1.

Figure 3:
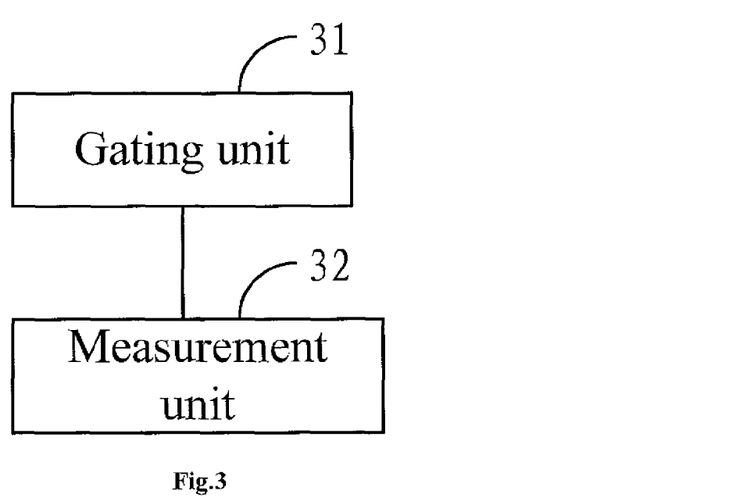
FIG. 3 is a first schematic view showing the structure of a processing unit in the automatic detection device of the LVDS interface matching resistor according to an embodiment of the present disclosure.

Therefore, the processing unit 3 included in the present disclosure, as shown in FIG. 3, may specifically includes:

a gating unit 31, for controlling the switch unit 2 in the multiple switch units 2 corresponding to the detection interface unit to be in the conducting state, so as to make the detection interface unit 1 corresponding to the switch unit 2 in the conducting state and the processing unit 3 form a detection loop; and a measuring unit 32 for measuring the LVDS interface matching resistor connected to the detection interface unit 1 corresponding to the switch unit 2 in the conducting state.

In the embodiment of the present disclosure, the measuring unit 32 can synchronously determine whether the matching resistor is in normal condition, when it acquires the measurement result of the matching resistor.

In the embodiment of the present disclosure, the processing unit 3 (specifically the measuring unit 32) can, through the formed detection loop, send a voltage or current signal with a certain value to a to-be-detected LVDS interface matching resistor, and performs corresponding calculation based on the voltage or current signal returned via the detection loop, to acquire the resistance value of the detected LVDS interface matching resistor.

In the embodiment of the present disclosure, in order to facilitate the realization of accurate detection, an encoding address can be set for each switch unit 2, so that the gating unit 31 in the processing unit 3 sends a gating control signal to the switch unit 2 based on the encoded address to make the switch unit 2 in a conducting or non-conducting state.

Figure 4:
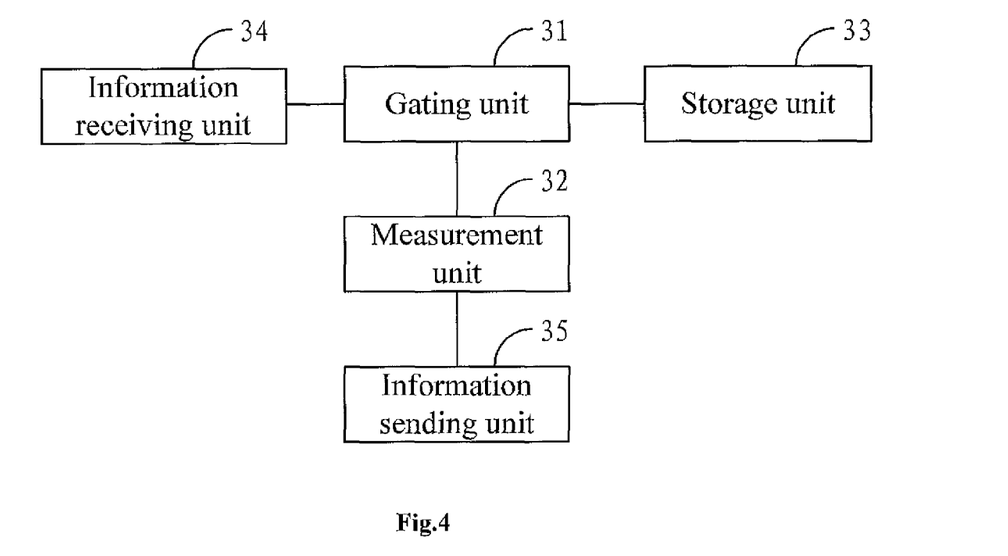
FIG. 4 is a second schematic view showing the structure of a processing unit in the automatic detection device of the LVDS interface matching resistor according to an embodiment of the present disclosure.

In that way, in a specific embodiment, the processing unit 3 included in the present disclosure, as shown in FIG. 4, may also specifically includes:

a storage unit 33, for recording the encoded address of the switch unit 2 correspondingly.

In specific application, the gating unit 31 can obtain the address information of corresponding switch unit 2 through querying the storage unit 33.

In the embodiment of the present disclosure, the processing unit 3 can determine which one of the LVDS interface matching resistors is in need of automatic detection based on externally inputted information; therefore, in the embodiment of the present disclosure, as shown in FIG. 4, the processing unit 3 may also specifically includes:

an information receiving unit 34 for receiving the externally inputted detection information.

The detection information included in the embodiment of the present disclosure may specifically include a serial number, location and other information of the detected LVDS interface matching resistor.

When the processing unit 3 acquires the resistance value of the detected LVDS interface matching resistor by measurement, it can also send the acquired measurement result to an external device of the automatic detection device, such as a PC, etc., therefore, in the embodiment of the present disclosure, as shown in FIG. 4, the processing unit may also specifically include:

an information sending unit 35 for sending the measurement result of the LVDS interface matching resistor to the external device.

Specifically, In the processing unit 3 in the embodiment of the present disclosure, a main chip can be a micro processing chip, for example, a 51 single chip, or can be other types of chips with the function of data processing, for example, Sunplus single chip, and the main chip is combined with an accessory communication module and a storage module to form a complete processing unit 3.

The switch unit 2 included in the embodiment of the present disclosure, specifically can be a single-channel or dual-channel switch.

Figure 5:
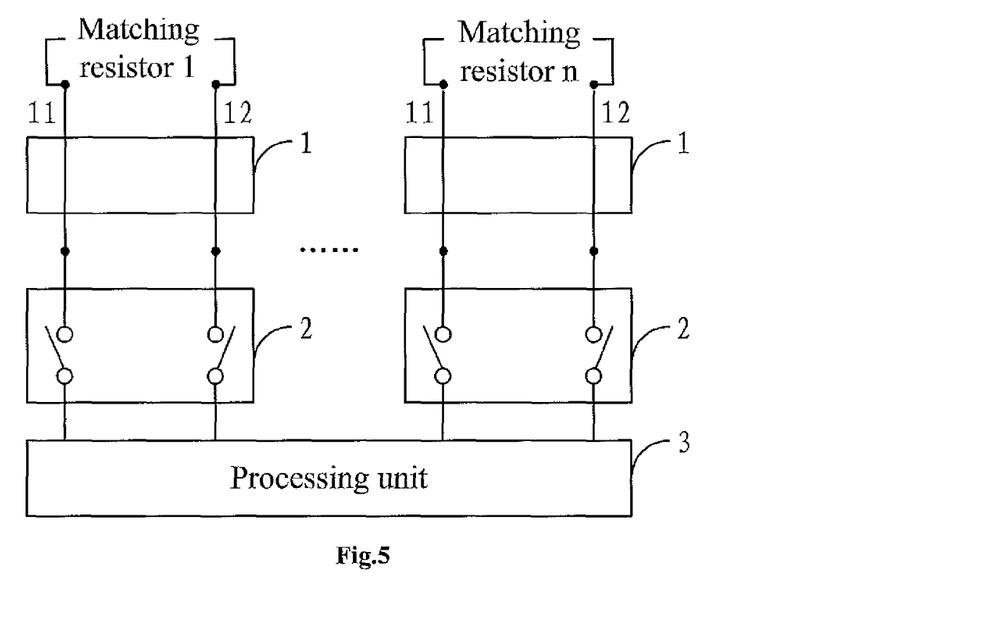
FIG. 5 is a second schematic view showing the structure of an automatic detection device of the LVDS interface matching resistor according to an embodiment of the present disclosure.

When the switch unit 2 is a dual-channel switch, the automatic detection device provided in the disclosed embodiment can include multiple dual-channel switch units. Thus, as shown in FIG. 5, the two channels of the switch unit 2 can be connected with the two terminals (11,12) of the corresponding detection interface unit 1, that is, one dual-channel switch unit is corresponding to one detection interface unit 1, while the two terminals of the detection interface unit 1 can be respectively connected to the two ends of the LVDS interface matching resistor, for example, the 100Ω resistor as shown in FIG. 1, (the two terminals of the detection interface unit 1 can also be respectively connected with a pair of LVDS lines which are connected to the two ends of the matching resistor), thus, when the switch unit 2 is in the conducting state, the processing unit 3 and the matching resistor can form a detection loop to realize the matching resistor detection.

Figure 6:
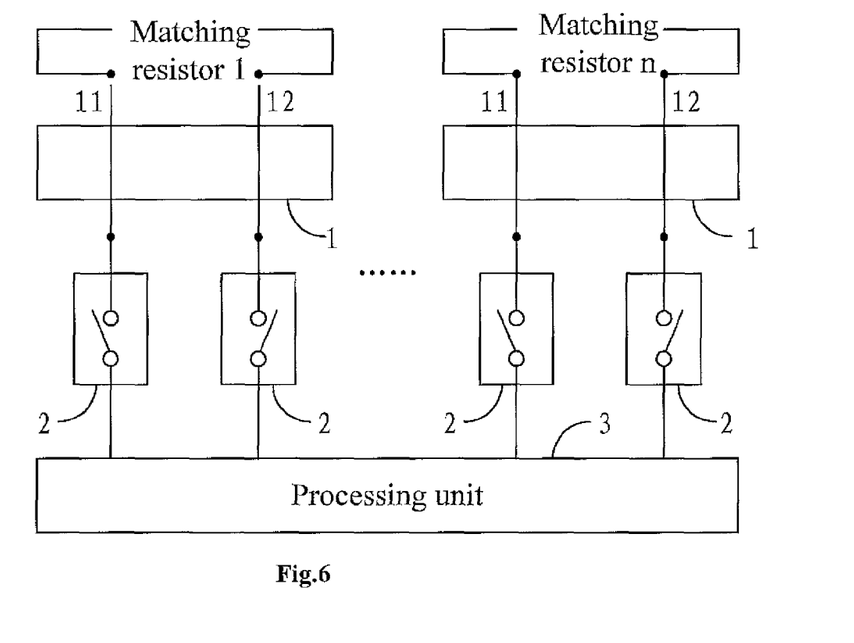
FIG. 6 is a third schematic view showing the structure of an automatic detection device of the LVDS interface matching resistor according to an embodiment of the present disclosure.

When the switch unit is a single-channel switch, the automatic detection device provided in the disclosed embodiment can include multiple single-channel switch units. Thus, as shown in FIG. 6, two single-channel switch units correspond to one detection interface unit 1, that is, the two terminals of the detection interface unit 1 are connected with two single-channel switch units respectively, which can also make the processing unit 3 and the matching resistor form a detection loop, so as to realize the matching resistor detection.

Figure 7:
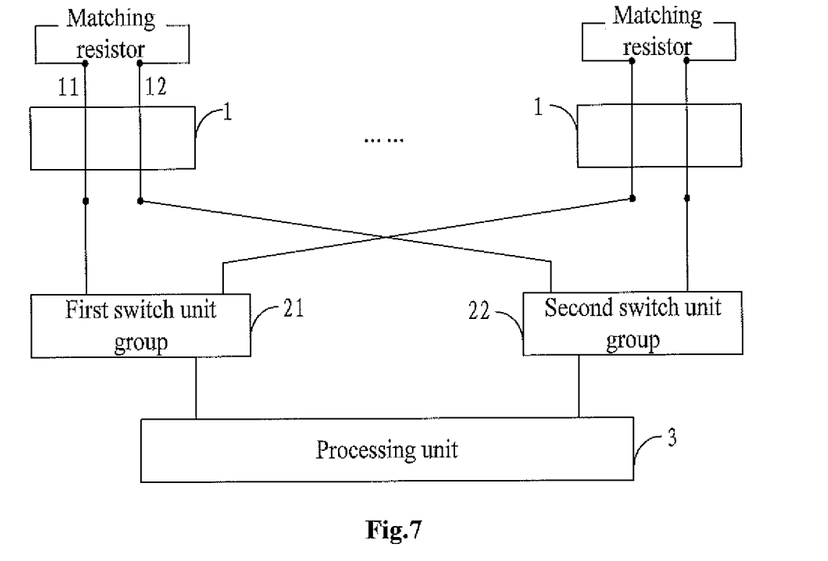
FIG. 7 is a fourth schematic view showing the structure of an automatic detection device of the LVDS interface matching resistor according to an embodiment of the present disclosure.

Whereas, in another embodiment of the present disclosure, there are multiple switch units; and as shown in FIG. 7, the multiple switch units can include:

a first switch unit group 21, wherein, one end of a switch unit 2 included in the first switch unit group 21 is connected with a terminal 11, which is one of the two terminals of the corresponding detection interface unit 1 in the multiple detection interface units 1, and the other end of the switch unit 12 included in the first switch unit group 21 is connected with the processing unit 3; and a second switch unit group 22, wherein, one end of a switch unit 2 included in the second switch unit group 22 is connected with terminal 12 (which is another terminal corresponding to the terminal 11 of the switch unit 2 in the first switch group 21), which is the other one of the two terminals of the corresponding detection interface unit 1 in the multiple detection interface units 1, and the other end of the switch unit 2 included in the second switch unit group 22 is connected with the processing unit 3;

What is described in detail hereinafter is one embodiment of a switch unit group in the automatic detection device of LVDS interface matching resistor provided in the embodiment of the present disclosure.

Figure 8:
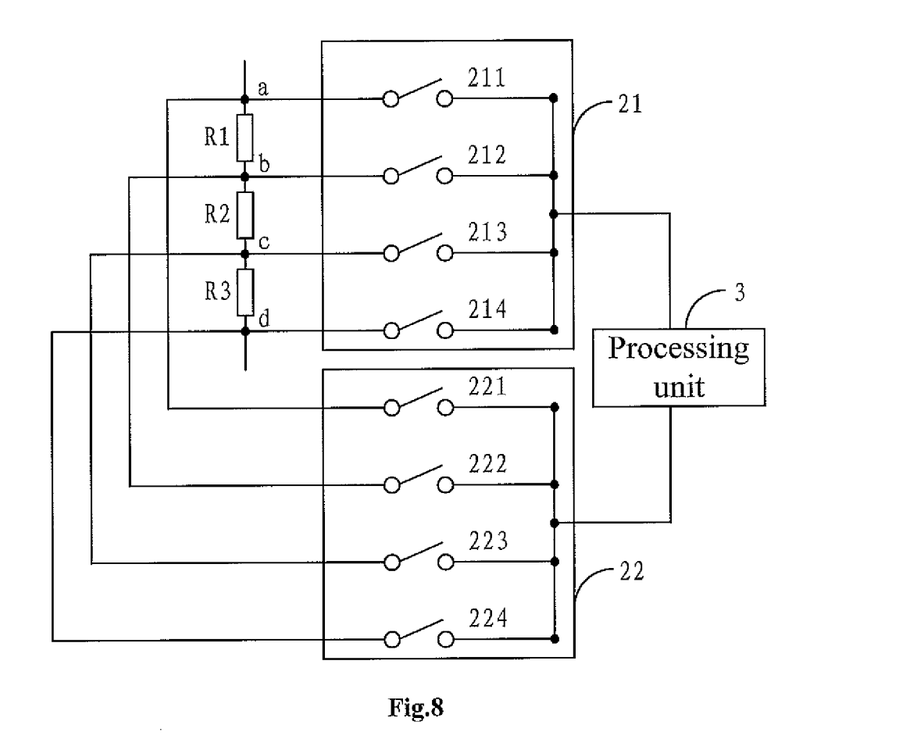
FIG. 8 is a fifth schematic view showing the structure of an automatic detection device of the LVDS interface matching resistor according to an embodiment of the present disclosure.

In the embodiment, as shown in FIG. 8, the first switch unit group 21 may specifically include four single-channel switch units 2, namely switch units 211, 212, 213, and 214, while the second switch unit group 22 also may include four single-channel switch units 2, namely switch units 221, 222, 223, and 224.

In the embodiment, four detection terminals, namely terminals a, b, c and d, can also be included, (the four detection terminals may respectively belong to three detection interface units 1 not shown in FIG. 8, that is to say, in the embodiment, two detection interface units 1 can share one terminal, for example, terminal a and terminal b may belong to a first detection interface unit 1, terminal b and terminal c may belong to a second detection interface unit 1, and terminal c and terminal d may belong to a third detection interface unit 1), and the above four terminals are connected with the two ends of each of three LVDS interface matching resistors R1, R2 and R3, respectively. The specific connection relationship is shown in FIG. 8.

In the embodiment, the switch unit 211 has one end connected with the terminal a and the other end connected with the processing unit 3; the switch unit 212 has one end connected with the terminal b and the other end connected with the processing unit 3; the switch unit 213 has one end connected with the terminal c and the other end connected with the processing unit 3; and the switch unit 214 has one end connected with the terminal d and the other end connected with the processing unit 3; the switch unit 221 has one end connected with the terminal a and the other end connected with the processing unit 3; the switch unit 222 has one end connected with the terminal b and the other end connected with the processing unit 3; the switch unit 223 has one end connected with the terminal c and the other end connected with the processing unit 3; and the switch unit 224 has one end connected with the terminal d and the other end connected with the processing unit 3.

Thus, when R1 is to be measured, the processing unit 3 can control the switch unit 211 in the first switch unit group 21 and the switch unit 222 in the second switch unit group 22 to be in the conducting state, respectively, so as to make the processing unit 3, the switch unit 211, the terminal a, R1, the terminal b, and the switch unit 222 form a detection loop, and the processing unit 3 can perform measurement to R1 by use of the detection loop.

In addition, if R1 is to be measured, the processing unit 3 can control the switch unit 212 in the first switch unit group 21 and the switch unit 221 in the second switch unit group 22 to be in the conduction state, respectively, so as to make the processing unit 3, the switch unit 212, the terminal b, R1, the terminal a, and the switch unit 221 form a detection loop, and the processing unit 3 can perform measurement to R1 by use of this detection loop.

For other matching resistors to be measured, the processing unit 3 can control corresponding switch units to be in the conducting state to form a detection loop, and the processing unit 3 can measure corresponding matching resistor by use of the formed detection loop.

In the embodiment of the present disclosure, the switch units 2 in the first switch unit group 21 and the second switch unit group 21 can be realized through analog switches, the dual-channel switch unit 2 can be built using a CH444 chip, and the single-channel switch unit 2 can be built using a CD4051 chip.

In the embodiment of the present disclosure, one switch unit group can be seen as a switch unit 2, thus, each switch unit in the switch unit group such as the switch unit 211 or the switch unit 221, can be seen as a channel. That is to say, in the embodiment of the present disclosure, the switch unit 2 can be a multi-channel switch unit 2, in that way, the automatic detection device provided in the embodiment of the present disclosure includes at least one multi-channel switch unit, and one channel in the multi-channel switch unit has one end connected with one terminal and the other end connected with the processing unit 3.

In the embodiment of the present disclosure, the detection interface unit 1 can make the terminal and the LVDS line matching resistor to be connected via a connection line, and the detection interface unit 1 can specifically be any type of serial port, parallel port, Ethernet or other communication interface.

Figure 9:
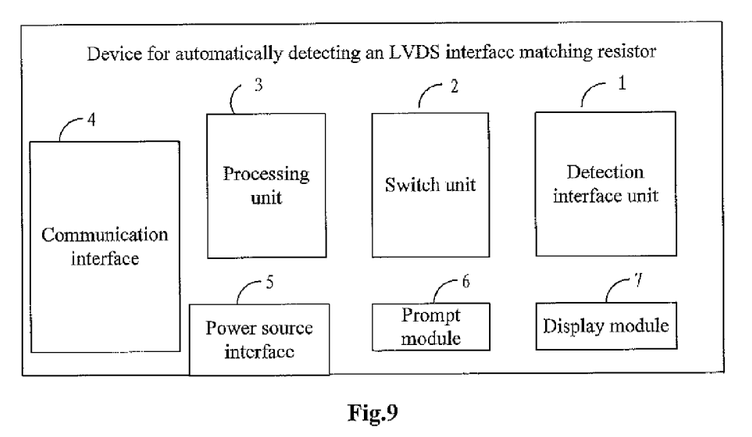
FIG. 9 is a sixth schematic view showing the structure of an automatic detection device of the LVDS interface matching resistor according to an embodiment of the present disclosure.

In order to realize the information interaction between the automatic detection device and an external device such as a PC, as shown in FIG. 9, the automatic detection device in the embodiment of the present disclosure can specifically include:

a communication interface 4, used for realizing information interaction between the automatic detection device and the external device.

Specifically, the communication interface 4 can be electrically connected with the processing unit 3 and other components.

In order to realize normal operation of all the components in the device, as shown in FIG. 9, the automatic detection device in the embodiment of the present disclosure, can also specifically include:

a power source interface 5, used for receiving externally inputted power source and supplying power source to electric devices included in the automatic detection device.

In addition, in a specific embodiment, as shown in FIG. 9, the automatic detection device can also include:

a prompt module 6, used for making a prompt when the processing unit 3 acquires the measurement result of the LVDS line matching resistor.

The prompt module 6 may be an LED light, and a driving element for driving the LED light to blink.

Whereas, in another specific embodiment, as shown in FIG. 9, the automatic detection device can also specifically include:

a display module 7, used for displaying the measurement result of the LVDS line matching resistor.

Besides, the automatic detection device may send the measurement result of the LVDS line matching resistor to an external device, such as a PC machine, etc., via the communication interface 4, and the measurement result is displayed by the accessory display device of the PC machine.

Figure 10:
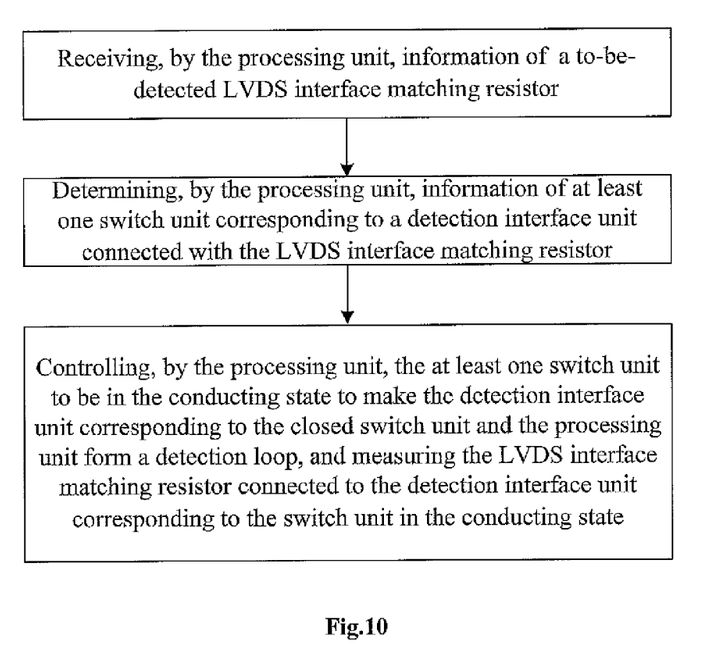
FIG. 10 is a schematic flow chart showing a method for automatically detecting the LVDS interface matching resistor according to an embodiment of the present disclosure.

The embodiment of the present disclosure also provides a method for automatically detecting LVDS interface matching resistor, as shown in FIG. 10, the method includes specifically:

receiving, by the processing unit 3, information of a to-be-detected LVDS interface matching resistor;

determining, by the processing unit 3, information of at least one switch unit 2 corresponding to a detection interface unit 1 connected with the LVDS interface matching resistor;

controlling, by the processing unit 3, the at least one switch unit 2 to be in a conducting state to make the detection interface unit 1 corresponding to the switch unit 2 in the conducting state and the processing unit 3 form a detection loop, and measuring the LVDS interface matching resistor connected to the detection interface unit 1 corresponding to the switch unit 2 in the conducting state.

When the connection relationship of components of the automatic detection device provided in the embodiment of the present disclosure are shown in FIG. 7, the method for automatically detecting LVDS interface matching resistor in the embodiment of the present disclosure can be realized by the processes as follows:

in the processing unit 3, the information receiving unit receives an instruction for detecting the LVDS interface lines matching resistor from an external device (for example, a PC), the gating unit 31 can acquire the encoded address information of the switch unit 2 corresponding to the LVDS interface lines matching resistor via querying the storage unit 33, and control a first switch unit and a second switch unit to be in the conducting state via sending a gating control instruction to the first switch unit, which is in the first switch unit group 21 and may be connected to the terminal 11 of a first detection interface unit, and the second switch unit, which is in the second switch unit group 22 and may be connected to the terminal 12 of the first detection interface unit, respectively; then, at this moment, the processing unit 3 and the detected LVDS interface matching resistor form a detection loop therebetween, the measurement unit 32 measure the LVDS interface matching resistor using the detection loop, and after corresponding measurement result is acquired, the measurement result is sent to the external device via the information sending unit 35.

Thus, it can be seen that, in the embodiment of the present disclosure, the step of controlling the at least one switch unit 2 to be in the conducting state by the processing unit 3 can specifically include:

controlling, by the processing unit 3, a first switch unit and a second switch unit to be in the conducting state respectively, wherein the first switch unit is in a first switch unit group 21, the second switch unit is in a second switch unit group 22, the first switch unit is connected to the first terminal in a first detection interface unit, and the second switch unit is connected to the second terminal of the first detection interface unit.

We can see from the above mentioned that, in the device for automatically detecting LVDS interface matching resistor provided in the present disclosure, multiple detection interface units, multiple switch units and a processing unit are set, wherein each detection interface unit includes two terminals for being connected with the two ends of the LVDS interface matching resistor; the multiple switch units and the multiple detection interface units are set correspondingly; the multiple switch unit is connected between the processing unit and a corresponding detection interface unit; the processing unit is used for controlling at least one switch unit in the multiple switch units to be in the conducting state, so that the detection interface unit corresponding to the switch unit in the conducting state and the processing unit form a detection loop; and by use of the detection loop, the processing unit performs measurement to the LVDS interface matching resistor connected to the detection interface unit corresponding to the switch unit in the conducting state, so as to realize automatic detection of the LVDS interface matching resistor. The device has the features of precise and reliable analysis, simple operation, and strong practicability, and effectively improves the detection efficiency of matching resistor and the failure analysis ability of the product.

The above mentioned are only the embodiments of the present disclosure, it should be noted that, a person skilled in the art may make modifications and alterations to these embodiments without departing from the principle of the disclosure, and the modifications and alterations also should be considered within the scope of the present disclosure.

What is claimed is:

1. A device for automatically detecting a low voltage differential signal (LVDS) interface matching resistor, comprising a plurality of detection interface units, at least one switch unit and a processing unit; wherein:

each detection interface unit comprises two terminals for being connected with two ends of the LVDS interface matching resistor;

the at least one switch unit and the plurality of detection interface units are set correspondingly, and a switch unit in the at least one switch unit corresponding to a detection interface unit is connected between the processing unit and the corresponding detection interface unit;

the processing unit is used for controlling the switch unit corresponding to the detection interface unit to be in a conducting state, so that the detection interface unit corresponding to the switch unit in the conducting state and the processing unit form a detection loop, and the processing unit, by use of the detection loop, performs measurement to the LVDS interface matching resistor connected to the detection interface unit corresponding to the switch unit in the conducting state.

2. The device according to claim 1, wherein, the switch unit is a dual-channel switch unit, and a plurality of dual-channel switch units are included in the device; and the detection interface units and the dual-channel switch units are connected in one to one correspondence, wherein, one ends of two channels in a dual-channel switch unit are connected with two terminals of a detection interface unit respectively, and the other ends of the two channels in the dual-channel switch unit are connected with the processing unit.

3. The device according to claim 1, wherein, the switch unit is a single-channel switch unit, and a plurality of single-channel switch units are included in the device; and each of the detection interface units is connected with two single-channel switch units correspondingly, wherein one ends of the two single-channel switch units are connected with two terminals of a detection interface unit respectively, and the other ends of the two single-channel switch units are connected with the processing unit.

4. The device according to claim 1, wherein, when there are a plurality of switch units, the switch units comprise:

a first switch unit group, wherein, one end of a switch unit included in the first switch unit group is connected with one of two terminals of the corresponding detection interface unit in the plurality of detection interface units, and the other end of the switch unit included in the first switch unit group is connected with the processing unit; and a second switch unit group, wherein, one end of a switch unit included in the second switch unit group is connected with the other one of the two terminals of the corresponding detection interface unit in the plurality of detection interface units, and the other end of the switch unit included in the second switch unit group is connected with the processing unit.

5. The device according to claim 1, wherein, the switch unit is a multi-channel switch unit, and at least one multi-channel switch unit is included in the device; and a channel in the multi-channel switch unit has one end connected with one of the terminals and the other end connected with the processing unit.

6. The device according to claim 1, wherein, the processing unit comprises:

a gating unit for controlling the switch unit corresponding to the detection interface unit to be in the conducting state, to make the detection interface unit corresponding to the switch unit in the conducting state and the processing unit form the detection loop;

a measurement unit for measuring the LVDS interface matching resistor connected to the detection interface unit corresponding to the switch unit in the conducting state.

7. The device according to claim 6, wherein, when the measurement unit acquires the measurement result of the LVDS interface matching resistor, the measurement unit synchronously determines whether the LVDS interface matching resistor is in a normal condition.

8. The device according to claim 6, wherein, the switch unit has an encoded address;

the processing unit also comprises:
a storage unit for recording the encoded address of the switch unit correspondingly.

9. The device according to claim 8, wherein, the gating unit queries the storage unit, acquires the encoded address of the corresponding switch unit, and sends a gating control signal to the corresponding switch unit based on the encoded address to make the corresponding switch unit to be in the conducting or non-conducting state.

10. The device according to claim 1, wherein, the processing unit also comprises:

an information receiving unit for receiving externally inputted detection information; and/or
an information sending unit for sending measurement result of the LVDS interface matching resistor to an external apparatus.

11. The device according to claim 1, further comprising at least one of a communication interface, a power source interface, a prompt module and a display module; wherein:

the communication interface is used for realizing information interaction between the device and an external apparatus;
the power source interface is used for receiving an externally inputted power source and supplying the power source to electric components included in the device;
the prompt module is used for making a prompt when the processing unit acquires the measurement result of the LVDS interface matching resistor; and
the display module is used for displaying the measurement result of the LVDS interface matching resistor acquired by the processing unit.

12. The device according to claim 11, wherein, the prompt module comprises an LED light and a driver for driving the LED light to blink.

13. The device according to claim 11, wherein, the measurement result of the LVDS interface matching resistor is sent to an external apparatus through the communication interface.

14. A method for automatically detecting an LVDS interface matching resistor, comprising:

receiving, by a processing unit, information of the LVDS interface matching resistor to be detected;
determining, by the processing unit, information of at least one switch unit corresponding to a detection interface unit connected with the LVDS interface matching resistor;
controlling, by the processing unit, the at least one switch unit to be in a conducting state to make the detection interface unit corresponding to the switch unit in the conducting state and the processing unit form a detection loop, and measuring the LVDS interface matching resistor connected to the detection interface unit corresponding to the switch unit in the conducting state.

15. The method according to claim 14, wherein, the step of controlling, by the processing unit, the at least one switch unit to be in the conducting state comprises:

controlling, by the processing unit, a first switch unit and a second switch unit to be in the conducting state respectively, wherein the first switch unit is in a first switch unit group, the second switch unit is in a second switch unit group, the first switch unit is connected to a first terminal in a first detection interface unit, and the second switch unit is connected to a second terminal of the first detection interface unit.

* * * * *